(12) United States Patent
Nakajima

(10) Patent No.: US 8,178,910 B2
(45) Date of Patent: May 15, 2012

(54) SEMICONDUCTOR DEVICE

(75) Inventor: Toshio Nakajima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/923,062

(22) Filed: Aug. 31, 2010

(65) Prior Publication Data

US 2010/0320538 A1   Dec. 23, 2010

Related U.S. Application Data

(63) Continuation of application No. 12/230,443, filed on Aug. 28, 2008, now Pat. No. 7,804,112.

(30) Foreign Application Priority Data

Aug. 29, 2007   (JP) .................................. 2007-222839

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl. .................. 257/213; 257/339; 257/E27.016

(58) Field of Classification Search .................. 257/213, 257/339, 492, E27.016
See application file for complete search history.

(56) References Cited

U.S. PATENT DOCUMENTS

| 2002/0185705 | A1 | 12/2002 | Saitoh et al. | |
|---|---|---|---|---|
| 2004/0094819 | A1 | 5/2004 | Saitoh et al. | |
| 2007/0262410 | A1 | 11/2007 | Ono et al. | 257/499 |
| 2008/0035992 | A1 | 2/2008 | Kawaguchi et al. | 257/331 |
| 2008/0246085 | A1 | 10/2008 | Saito et al. | 257/342 |
| 2008/0246096 | A1 | 10/2008 | Sakakibara et al. | 257/401 |

FOREIGN PATENT DOCUMENTS

JP   2003-101022   4/2003

*Primary Examiner* — David S Blum
(74) *Attorney, Agent, or Firm* — Rabin & Berdo, P.C.

(57) ABSTRACT

The semiconductor device according to the present invention includes an SJMOSFET having a plurality of base regions formed at an interval from each other and an SBD (Schottky Barrier Diode) having a Schottky junction between the plurality of base regions. The SBD is provided in parallel with a parasitic diode of the SJMOSFET.

17 Claims, 5 Drawing Sheets

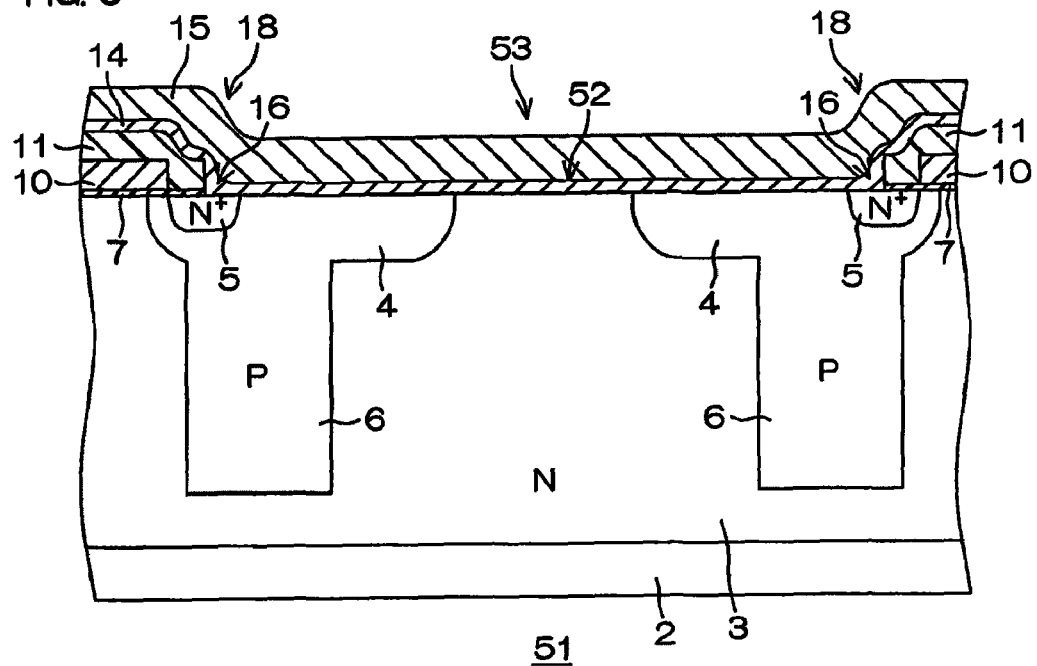
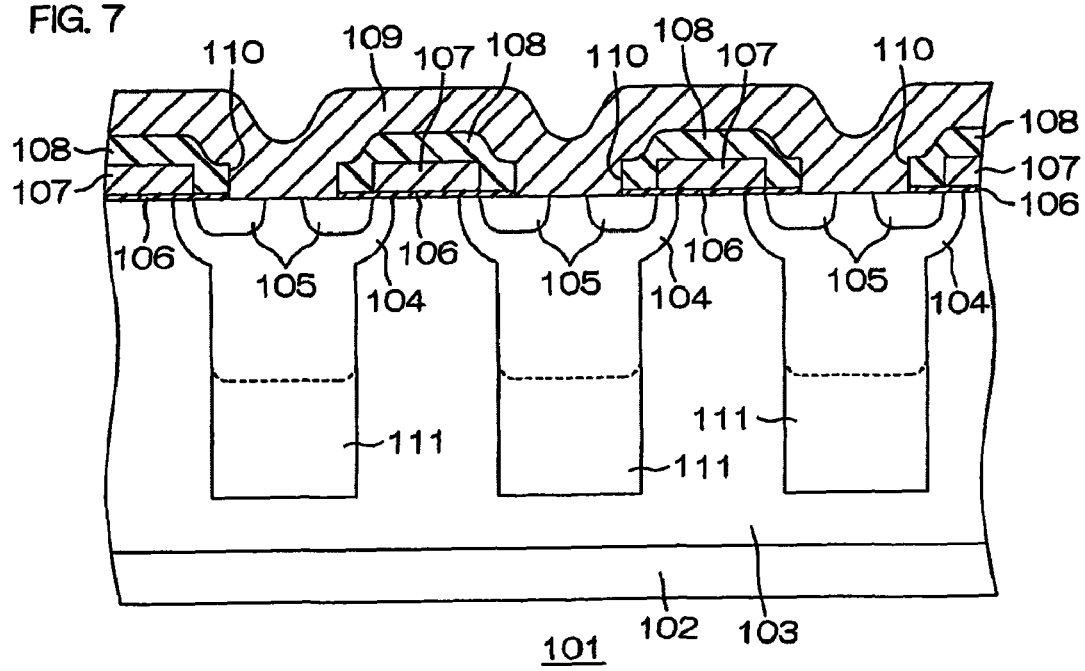

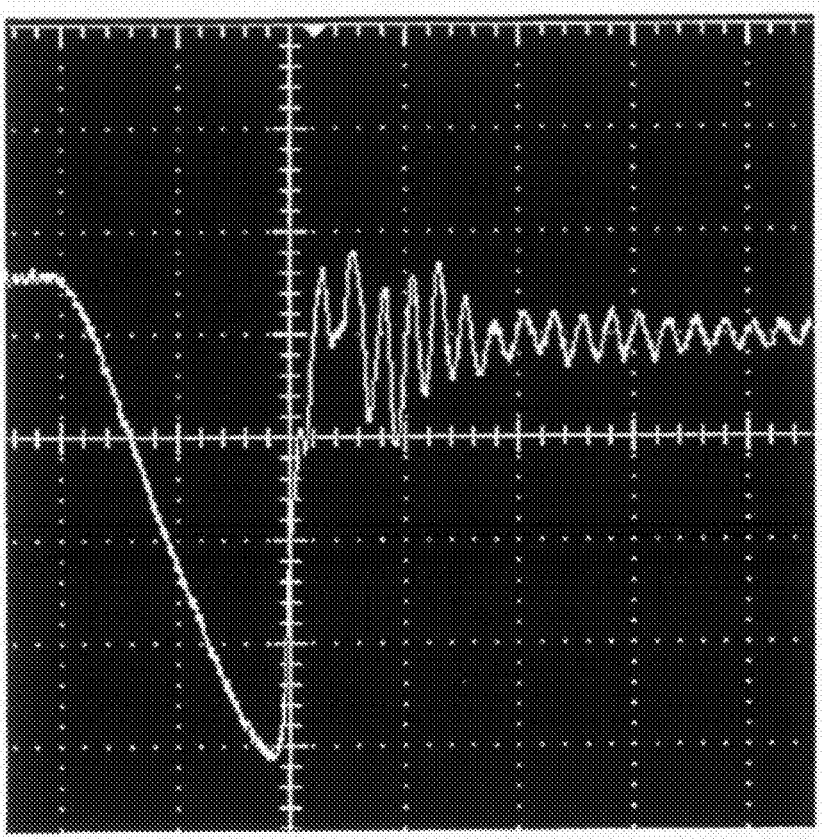

SEMICONDUCTOR DEVICE

RELATED APPLICATIONS

This application is a continuation of application Ser. No. 12/230,443, now U.S. Pat. No. 7,804,112, filed on Aug. 28, 2008, and claims the benefit of Japanese application Serial No. 2007-222839, filed Aug. 29, 2007, the subject matter of which is incorporated herein by reference.

BACKGROUND OF THE INVENTION

1. Field of the Invention

The present invention relates to a semiconductor device employed as a switching device.

2. Description of Related Art

In relation to a power MOSFET (Metal Oxide Semiconductor Field-Effect Transistor), an MOSFET (SJMOSFET) having an SJ (Super Junction) structure for reducing the on-resistance and increasing the withstand voltage is known in general.

FIG. 7 is a schematic sectional view of a conventional semiconductor device including an SJMOSFET.

The semiconductor device 101 includes an N$^+$-type (high-concentration N-type) substrate 102. An N-type drift layer 103 is laminated on the N$^+$-type substrate 102. On the other hand, a drain electrode (not shown) is formed on a back surface (opposite to the side provided with the drift layer 103) of the N$^+$-type substrate 102.

A plurality of P-type base regions 104 are formed on a surface layer portion of the drift layer 103 at intervals from one another. An N$^+$-type source region 105 is selectively formed in each base region 104.

A gate oxide film 106 made of SiO$_2$ (silicon oxide) is formed on the drift layer 103. Gate electrodes 107 are formed on the gate oxide film 106. Each gate electrode 107 is provided over base regions 104 adjacent to each other in a prescribed direction, and extends in a direction orthogonal to the prescribed direction. An interlayer dielectric film 108 made of SiO$_2$ is laminated on the gate oxide film 106, to cover the gate electrodes 107.

A source electrode 109 is formed on the interlayer dielectric film 108. Contact holes 110 are formed on the base regions 104 to penetrate through the interlayer dielectric film 108 and the gate oxide film 106, and the source electrode 109 is connected to the base regions 104 and the source regions 105 through the contact holes 110.

P-type resurf layers 11 are formed in the drift layer 103 correspondingly to the base regions 104 respectively. Each resurf layer 111 extends from the corresponding base region 104 toward the N$^+$-type substrate 102. Thus, portions of the drift layer 103 and the resurf layers 111 are alternately aligned, to form an SJ structure.

When applied to an inverter for a liquid crystal backlight or the like as a switching device, this SJMOSFET may not include a regenerative diode, but a parasitic diode formed by the drift layer 103 and each base region 104 may be used as a regenerative diode.

If a reverse bias is applied to the parasitic diode of the SJMOSFET, however, the drift layer 103 is so rapidly depleted that carriers stored in the drift layer 103 in an ON-state of the parasitic diode disappear at a stretch when the parasitic diode is turned off. When the parasitic diode is turned off, therefore, a reverse current flows in the parasitic diode and rapidly returns to zero (exhibits a large rate of time change), to provide the so-called hard recoverability. This hard recoverability results in occurrence of a noise (recovery noise).

In order to solve this problem, there is proposed a technique of reducing the depth of the resurf layers 11 or increasing the thickness of the drift layer 103 thereby separating bottom surfaces of the resurf layers 111 from the N$^+$-type substrate 102, as shown by broken lines in FIG. 7 (refer to Patent Document 1, for example). According to this proposal, a depletion layer gradually extends from an interface between the bottom surface of each resurf layer 111 and the drift layer 103 between the bottom surface of the resurf layer 111 and the N$^+$-type substrate 102 when a reverse bias is applied to the parasitic diode, whereby the reverse current flowing in the parasitic diode can softly return to zero (reverse recoverability of the parasitic diode can be approximated to soft recoverability).

However, it is known that the on-resistance of the SJMOSFET is increased as the ratio of the interval between the bottom surface of the resurf layer 111 and the N$^+$-type substrate 102 to the thickness of the resurf layer 111 approaches 1. If an interval between the bottom surface of the resurf layer 111 and the N$^+$-type substrate 102 is sufficiently increased in order to effectively prevent occurrence of a noise, therefore, the effect of reducing the on-resistance by the SJ structure is spoiled, and the on-resistance of the SJMOSFET is generally equalized with that of a normal MOSFET having no SJ structure.

SUMMARY OF THE INVENTION

An object of the present invention is to provide a semiconductor device capable of exhibiting soft recoverability without spoiling an effect attained by an SJ structure.

A semiconductor device according to one aspect of the present invention includes: an SJMOSFET having a plurality of base regions formed at an interval from each other; and an SBD (Schottky Barrier Diode), having a Schottky junction between the plurality of base regions, provided in parallel with a parasitic diode of the SJMOSFET.

According to this structure, the semiconductor device includes the SJMOSFET and the SBD. The SBD is provided in parallel with the parasitic diode of the SJMOSFET. Therefore, a current flowing between the source and the drain of the SJMOSFET when the SBD and the parasitic diode of the SJMOSFET are turned off has a waveform obtained by combining the waveforms of currents flowing in the SBD and the parasitic diode respectively. The SBD has no effect of storing carriers, and no reverse current flows therein when the same is turned off. Therefore, the current flowing between the source and the drain of the SJMOSFET has such a waveform that a reverse current is small and softly changes when returning to zero. The reverse current is so small as to require a short time (reverse recovery time) for returning to zero after the SBD and the parasitic diode of the SJMOSFET are turned off. Further, the SBD is so provided that no influence is exerted on effects of reducing the on-resistance and increasing the withstand voltage by the SJ structure. Thus, the semiconductor device can exhibit high-speed and soft recoverability, without spoiling the effects of the SJ structure. Consequently, low on-resistance, a high withstand voltage, high-speed switching and a low noise can be attained.

Further, the Schottky junction of the SBD is formed between the plurality of base regions of the SJMOSFET. That is, the SJMOSFET and the SBD are mixedly formed in the same region. Therefore, the size of the semiconductor device can be reduced as compared with a structure obtained by forming the SBD in a region different from that provided with the SJMOSFET.

The Schottky junction may be formed in a region having a triangular shape in plan view with vertexes of three base regions adjacent to one another, or may be formed between two base regions adjacent to each other.

Preferably, the base regions are zigzagged. Thus, the base regions can be efficiently arranged, to reduce the size of the semiconductor device.

Preferably, the semiconductor device further includes a semiconductor layer of a first conductivity type and an interlayer dielectric film formed on the semiconductor layer, the base regions have a second conductivity type and are formed on a surface layer portion of the semiconductor layer, the SJMOSFET has a source electrode formed on the interlayer dielectric film and a source region of the first conductivity type formed on surface layer portions of the base regions and connected with the source electrode through a source contact hole formed in the interlayer dielectric film, and the Schottky junction is formed by connecting the source electrode to a surface of the semiconductor layer through an anode contact hole formed in the interlayer dielectric film between the plurality of base regions. Thus, the structure of the semiconductor device can be simplified by employing the source electrode of the SJMOSFET also as the anode electrode of the SBD.

A region of the surface layer portion of the semiconductor layer opposed to the anode contact hole may be doped with a second conductivity type impurity. When the region of the surface layer portion of the semiconductor layer opposed to the anode contact hole is formed by a second conductivity type region having a low concentration and a small thickness, a weak P-N junction can be formed by the second conductivity type region and the semiconductor layer of the first conductivity type, for suppressing generation of a leakage current in the SBD.

The foregoing and other objects, features and effects of the present invention will become more apparent from the following detailed description of the embodiments with reference to the attached drawings.

BRIEF DESCRIPTION OF THE DRAWING

FIG. 6 is a schematic sectional view of the semiconductor device taken along the line VI-VI in FIG. 5.

FIG. 7 is a schematic sectional view of a conventional semiconductor device.

FIG. 8 illustrates the waveform of a current flowing in a parasitic diode when the parasitic diode is turned off.

DETAILED DESCRIPTION OF PREFERRED EMBODIMENTS

Embodiments of the present invention are now described in detail with reference to the attached drawings.

Figure 1:
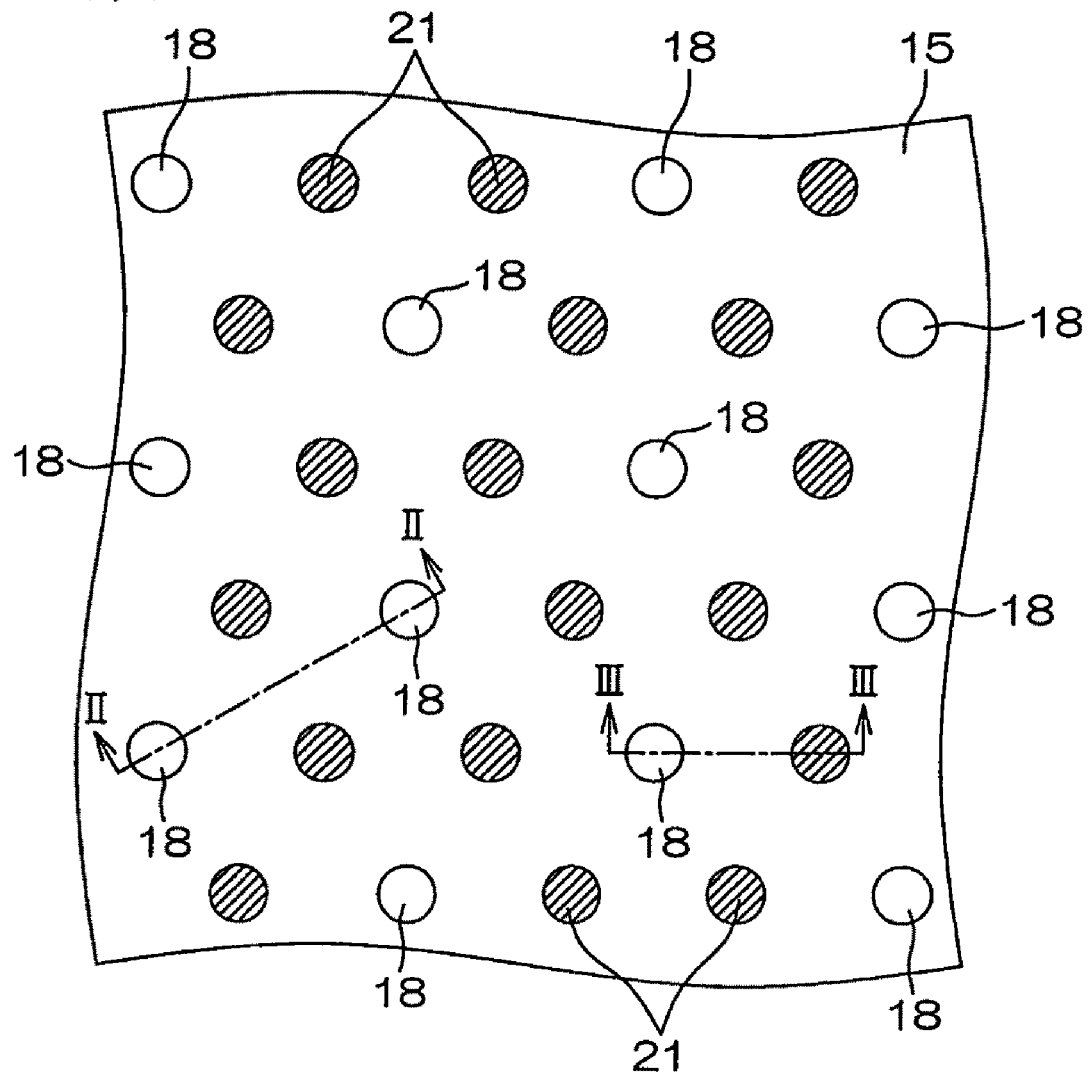
FIG. 1 is a schematic plan view of a semiconductor device according to a first embodiment of the present invention.
Figure 2:
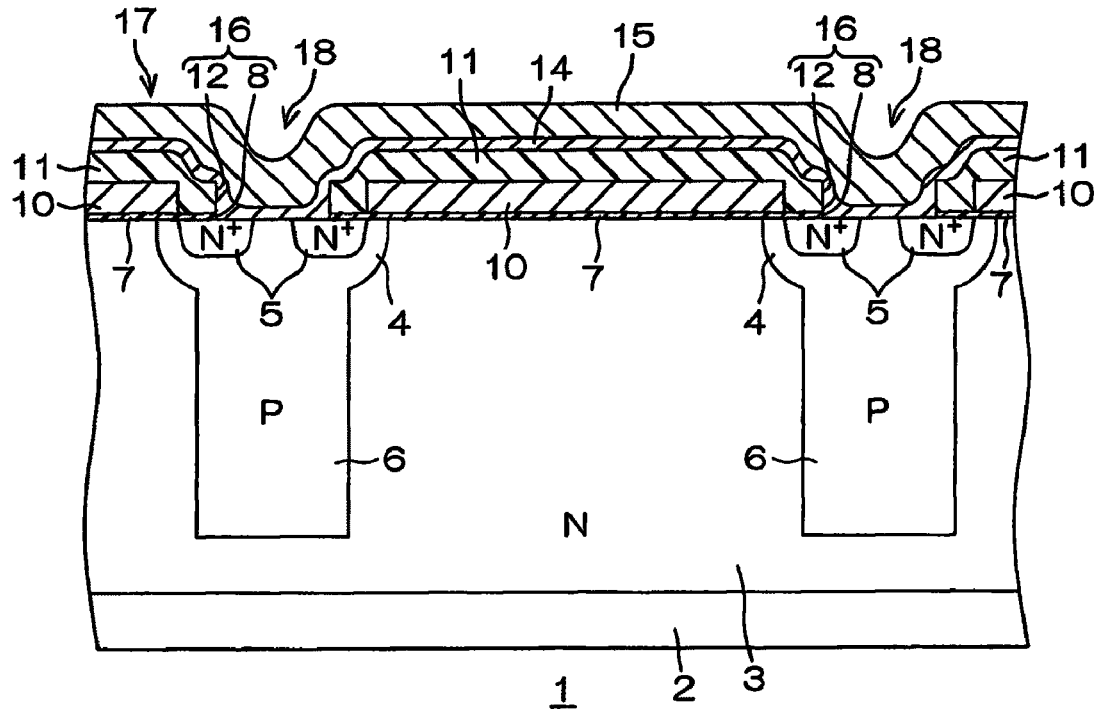
FIG. 2 is a schematic sectional view of the semiconductor device taken along the line II-II in FIG. 1.
Figure 3:
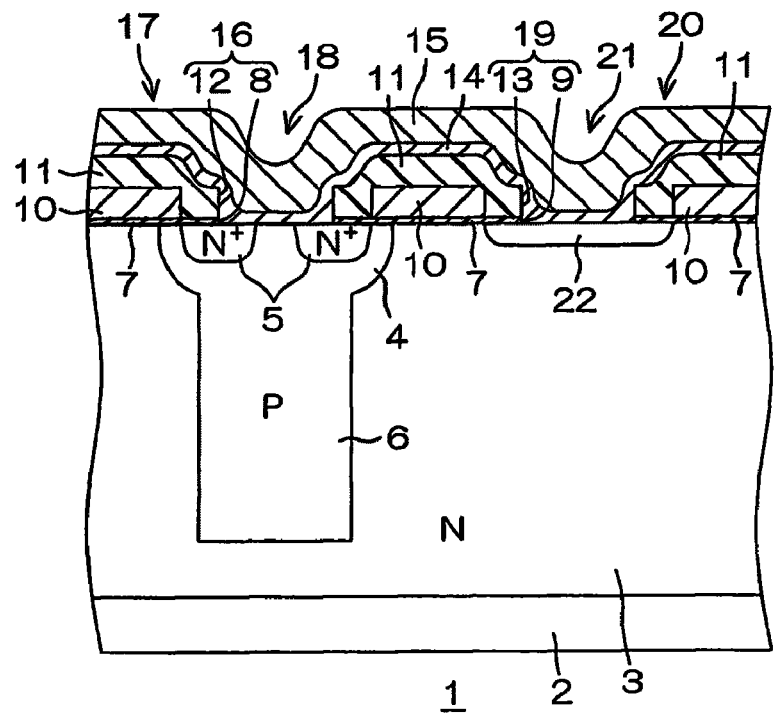
FIG. 3 is a schematic sectional view of the semiconductor device taken along the line III-III in FIG. 1.

FIG. 1 is a schematic plan view of a semiconductor device according to a first embodiment of the present invention. FIG. 2 is a schematic sectional view of the semiconductor device taken along the line II-II in FIG. 1. FIG. 3 is a schematic sectional view of the semiconductor device taken along the line in FIG. 1.

As shown in FIGS. 2 and 3, the semiconductor device 1 includes an $N^+$-type substrate 2. A drift layer 3 as an N-type semiconductor layer is laminated on the $N^+$-type substrate 2. On the other hand, a drain electrode (not shown) is formed on a back surface (opposite to the side provided with the drift layer 3) of the $N^+$-type substrate 2.

A plurality of P-type base regions 4 are formed on a surface layer portion of the drift layer 3. The plurality of base regions 4 form a plurality of columns, and are arranged at a constant pitch in the column direction in each column. Between the columns of the base regions 4, the position of each base region 4 deviates by a half pitch (half the pitch of the arrangement of the base regions 4 in the column direction). That is, the plurality of base regions 4 are zigzagged at intervals from one another. According to this embodiment, the plurality of base regions 4 are so laid out that six base regions 4 are arranged on the positions of the vertexes of an equilateral hexagon centering on each base region 4.

An $N^+$-type source region 5 is selectively formed in each base region 4. The source region 5 is in the form of a ring surrounding a center of the base region 4 in plan view.

A P-type resurf layer 6 is formed in the drift layer 3 correspondingly to each base region 4. Each resurf layer 6 extends from the corresponding base region 4 toward the $N^+$-type substrate 2. Thus, portions of the N-type drift layer 3 and the P-type resurf layers 6 are alternately aligned, to form an SJ structure.

A gate insulating film 7 made of $SiO_2$ is formed on the drift layer 3. Through-holes 8 so sized as to face central portions of the base regions 4 and parts of the source regions 5 around the same are formed in the gate insulating film 7, on positions opposed to the base regions 4 respectively. Further, a through-hole 9 generally identical in size to the through-holes 8 is formed in the gate insulating film 7 on a position of a center of a triangle having three base regions 4 adjacent to one another at constant intervals (see FIG. 3). A surface of the drift layer 3 faces the through-hole 9.

Gate electrodes 10 made of polysilicon doped with an N-type impurity in a high concentration, for example, are formed on the gate insulating film 7. The gate electrodes 10 cover the overall regions other than regions of a prescribed width from the periphery of the gate insulating film 7.

An interlayer dielectric film 11 made of $SiO_2$ is formed on (to cover) the gate insulating film 7 and the gate electrodes 10. Through-holes 12 identical in size to the through-holes 8 are formed in the interlayer dielectric film 11, on positions opposed to the through-holes 8 of the gate insulating film 7. Further, a through-hole 13 identical in size to the through-hole 9 is formed in the interlayer dielectric film 11, on a position opposed to the through-hole 9 of the gate insulating film 7.

A source electrode 15 made of Al (aluminum) is formed on the interlayer dielectric film 11 through a barrier film 14 having a multilayer structure of Ti (titanium)/TiN (titanium nitride).

The barrier film 14 and the source electrode 15 enter the through-holes 8 and 12, and are connected to the central portions of the base regions 4 and the parts of the source regions 5 around the same. In other words, the through-holes 8 and 12 form source contact holes 16. The barrier film 14 and the source electrode 15 are connected to the central portions of the base regions 4 and the parts of the source regions 5 around the same through the source contact holes 16. Thus, the semiconductor device 1 includes an SJMOSFET 17 consisting of the N$^+$-type substrate 2, the drift layer 3, the base regions 4, the source regions 5, the resurf layer 6, the gate insulating film 7, the gate electrodes 10, the source electrode 15 and the drain electrode. On the surface of the source electrode 15, recesses 18 circular in plan view as shown in FIG. 1 are formed on positions opposed to the source contact holes 16 respectively.

The barrier film 14 and the source electrode 15 enter the through-holes 9 and 13, and are connected to the surface of the drift layer 3. In other words, the through-holes 9 and 13 form an anode contact hole 19. The barrier film 14 and the source electrode 15 are connected to the surface of the drift layer 3 through the anode contact hole 19. Thus, the barrier film 14 and the source electrode 15 and the drift layer 3 form a Schottky junction, and the semiconductor device 1 includes an SBD 20 connected in parallel with parasitic diodes formed by the drift layer 3 and the base regions 4 between the source electrode 15 and the drain electrode. On the surface of the source electrode 15, recesses 21 circular in plan view as shown in FIG. 1 in a hatched manner are formed on positions opposed to the anode contact holes 19 respectively.

Figure 4:
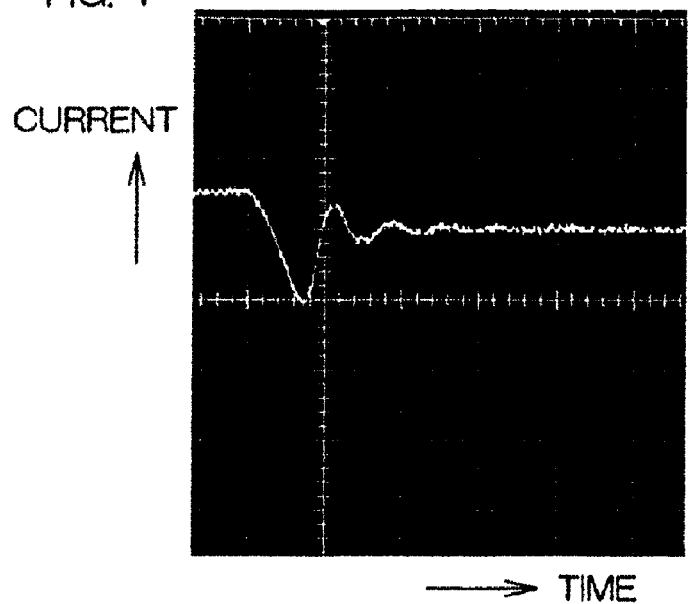
FIG. 4 illustrates the waveform of a current flowing between a source electrode and a drain electrode (between a source and a drain) when an SBD and a parasitic diode of an SJMOSFET are turned off.

FIG. 4 shows the waveform of a current flowing between the source electrode 15 and the drain electrode (between the source and the drain) when the SBD 20 and the parasitic diodes of the SJMOSFET 17 are turned off.

In the semiconductor device 1, the SBD 20 is provided in parallel with the parasitic diodes of the SJMOSFET 17. Thus, the current flowing between the source electrode 15 and the drain electrode (between the source and the drain) when the SBD 20 and the parasitic diodes of the SJMOSFET 17 are turned off has a waveform obtained by combining the waveforms of currents flowing in the SBD 20 and the parasitic diodes respectively. The SBD 20 has no effect of storing carriers, and no reverse current flows therein when the same is turned off. Therefore, the current flowing between the source and the drain has such a waveform that a reverse current is small and softly changes when returning to zero. The reverse current is so small as to require a short time (reverse recovery time) for returning to zero after the SBD 20 and the parasitic diodes of the SJMOSFET 17 are turned off. Further, the SBD 20 is so provided that no influence is exerted on effects of reducing the on-resistance and increasing the withstand voltage by the SJ structure. Thus, the semiconductor device 1 can exhibit high-speed and soft recoverability without spoiling the effects of the SJ structure. Consequently, low on-resistance, a high withstand voltage, high-speed switching and a low noise can be attained.

Further, the Schottky junction of the SBD 20 is formed between the plurality of base regions 4 of the SJMOSFET 17. That is, the SJMOSFET 17 and the SBD 20 are mixedly formed in the same region. Therefore, the size of the semiconductor device 1 can be reduced as compared with a structure obtained by forming the SBD 20 in a region different from that provided with the SJMOSFET 17.

Further, the base regions 4 can be efficiently arranged due to the zigzag arrangement, whereby the size of the semiconductor device 1 can be further reduced.

In the semiconductor device 1, the source electrode 15 of the SJMOSFET 17 is employed also as the anode electrode of the SBD 20, thereby simplifying the structure of the semiconductor device 1.

In the semiconductor device 1, further, a region 22 of the drift layer 3 opposed to the anode contact hole 19 is doped with a P-type impurity, as shown in FIG. 3. The region 22 is so formed by a P-type region having a low concentration and a small thickness that a weak P-N junction can be formed by the P-type region 22 and the N-type drift layer 3, thereby suppressing generation of a leakage current in the SBD 20.

In addition, the through-hole 9 is so formed in the gate insulating film 7 as to reduce the area of the gate insulating film 7, thereby reducing the gate-to-drain capacitance. Consequently, the switching rate of the SJMOSFET 17 can be further improved.

Figure 5:
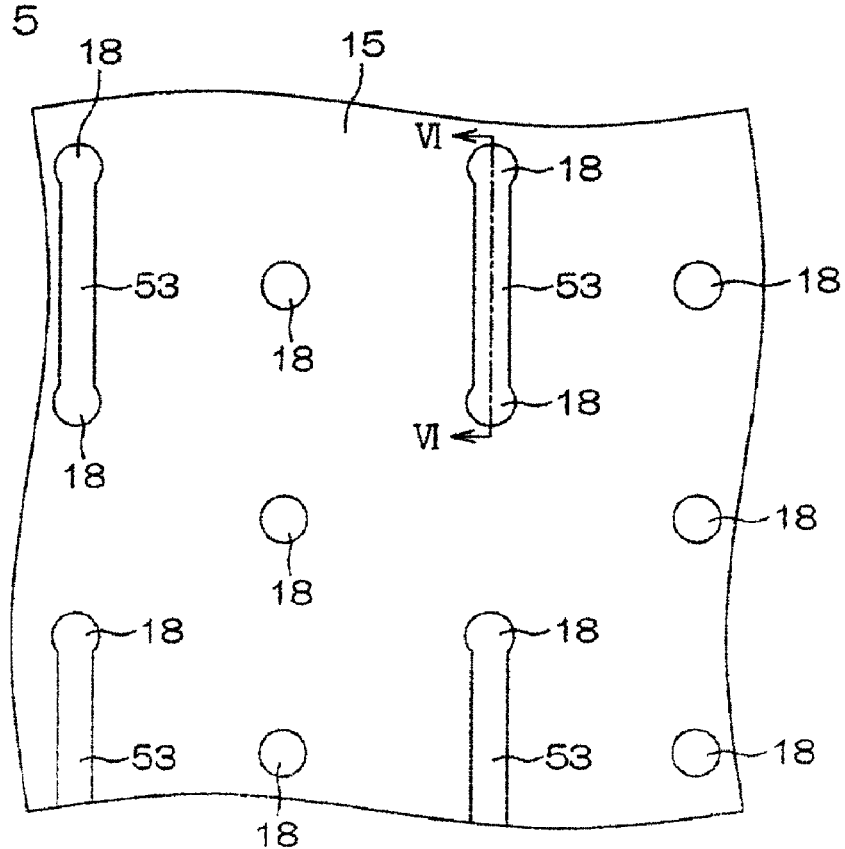
FIG. 5 is a schematic plan view of a semiconductor device according to a second embodiment of the present invention.

FIG. 5 is a schematic plan view of a semiconductor device according to a second embodiment of the present invention. FIG. 6 is a schematic sectional view of the semiconductor device 51 taken along the line VI-VI in FIG. 5. Referring to FIGS. 5 and 6, portions corresponding to the aforementioned ones are denoted by the same reference numerals respectively. In the following, redundant description is omitted as to the portions having the same reference numerals as the above.

In the semiconductor device 51 shown in FIGS. 5 and 6, an anode contact hole 52 extending in a column direction is formed to penetrate through a gate insulating film 7 and an interlayer dielectric film 11, so that source contact holes 16 facing base regions 4 respectively communicate with each other between two base regions 4 adjacent to each other in the column direction. A barrier film 14 and a source electrode 15 enter the anode contact hole 52, and are connected to a surface of a drift layer 3. Thus, the barrier film 14 and the source electrode 15 and the drift layer 3 form a Schottky junction between the two base regions 4. On a surface of the source electrode 15, recesses 18 circular in plan view are formed on positions opposed to the source contact holes 16 respectively, as shown in FIG. 5. On the surface of the source electrode 15, further, a longitudinal recess 53 communicating with each pair of recesses 18 is formed on a position opposed to the anode contact hole 52.

Also according to this structure, effects similar to those of the semiconductor device 1 can be attained.

The conductivity types of the semiconductor portions of the semiconductor devices 1 and 51 may be inverted. In other words, the P-type portions may be converted to N-type portions and vice versa in the semiconductor devices 1 and 51.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-222839 filed with the Japan Patent Office on Aug. 29, 2007, the disclosure of which is incorporated herein by reference.

What is claimed is:

1. A semiconductor device comprising:
    an SJMOSFET (Super Junction Metal Oxide Semiconductor Field-Effect Transistor) having a plurality of base regions formed at an interval from each other; and
    an SBD (Schottky Barrier Diode), having a plurality of Schottky junctions so laid out that six Schottky junctions are disposed at the vertexes of an equilateral hexagon centered on each of the plurality of base regions, provided in parallel with a parasitic diode of the SJMOSFET.
2. The semiconductor device according to claim 1, wherein each of the Schottky junctions is formed in a region having a triangular shape in plan view with vertexes of three base regions adjacent to one another.

3. The semiconductor device according to claim 1, wherein each of the Schottky junctions is formed between two base regions adjacent to each other.

4. The semiconductor device according to claim 1, wherein the base regions are zigzagged.

5. The semiconductor device according to claim 1, further comprising:
- a semiconductor layer of a first conductivity type; and
- an interlayer dielectric film formed on the semiconductor layer, wherein
- the base regions have a second conductivity type, and are formed on a surface layer portion of the semiconductor layer,
- the SJMOSFET has a source electrode formed on the interlayer dielectric film and a source region of the first conductivity type formed on surface layer portions of the base regions and connected with the source electrode through a source contact hole formed in the interlayer dielectric film, and
- each of the Schottky junctions is formed by connecting the source electrode to a surface of the semiconductor layer through an anode contact hole formed in the interlayer dielectric film between the plurality of base regions.

6. The semiconductor device according to claim 5, wherein a region of the surface layer portion of the semiconductor layer opposed to the anode contact hole is doped with a second conductivity type impurity.

7. A semiconductor device comprising:
- an SJMOSFET (Super Junction Metal Oxide Semiconductor Field-Effect Transistor) having a plurality of base regions formed at an interval from each other, the plurality of base regions being so laid out that six base regions are arranged at the vertexes of an equilateral hexagon centered on each base region; and
- an SBD (Schottky Barrier Diode), having a Schottky junction between the plurality of base regions, provided in parallel with a parasitic diode of the SJMOSFET.

8. The semiconductor device according to claim 7, wherein the Schottky junction is formed in a region having a triangular shape in plan view with vertexes of three base regions adjacent to one another.

9. The semiconductor device according to claim 7, wherein the Schottky junction is formed between two base regions adjacent to each other.

10. The semiconductor device according to claim 7, wherein the base regions are zigzagged.

11. The semiconductor device according to claim 7, further comprising:
- a semiconductor layer of a first conductivity type; and
- an interlayer dielectric film formed on the semiconductor layer,
- wherein the base regions have a second conductivity type, and are formed on a surface layer portion of the semiconductor layer,
- wherein the SJMOSFET has a source electrode formed on the interlayer dielectric film and a source region of the first conductivity type formed on surface layer portions of the base regions and connected with the source electrode through a source contact hole formed in the interlayer dielectric film, and
- wherein the Schottky junction is formed by connecting the source electrode to a surface of the semiconductor layer through an anode contact hole formed in the interlayer dielectric film between the plurality of base regions.

12. The semiconductor device according to claim 11, wherein a region of the surface layer portion of the semiconductor layer opposed to the anode contact hole is doped with a second conductivity type impurity.

13. A semiconductor device comprising:
- an SJMOSFET (Super Junction Metal Oxide Semiconductor Field-Effect Transistor) having a plurality of base regions formed at an interval from each other; and
- an SBD (Schottky Barrier Diode), having a longitudinal Schottky junction extending between a pair of the base regions to be in contact with the pair of the base regions, provided in parallel with a parasitic diode of the SJMOSFET.

14. The semiconductor device according to claim 13, wherein the Schottky junction extends between two base regions adjacent to each other.

15. The semiconductor device according to claim 13, wherein the base regions are zigzagged.

16. The semiconductor device according to claim 13, further comprising:
- a semiconductor layer of a first conductivity type; and
- an interlayer dielectric film formed on the semiconductor layer,
- wherein the base regions have a second conductivity type, and are formed on a surface layer portion of the semiconductor layer,
- wherein the SJMOSFET has a source electrode formed on the interlayer dielectric film and a source region of the first conductivity type formed on surface layer portions of the base regions and connected with the source electrode through a source contact hole formed in the interlayer dielectric film, and
- wherein the Schottky junction is formed by connecting the source electrode to a surface of the semiconductor layer through an anode contact hole formed in the interlayer dielectric film so as to communicate with a pair of the source contact holes corresponding to the pair of the base regions.

17. The semiconductor device according to claim 16, wherein a region of the surface layer portion of the semiconductor layer opposed to the anode contact hole is doped with a second conductivity type impurity.

* * * * *